(12) United States Patent
Lai

(10) Patent No.: US 7,821,771 B2
(45) Date of Patent: Oct. 26, 2010

(54) APPARATUS FOR STORING ELECTRICAL ENERGY

(75) Inventor: James Chyi Lai, Saint Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 321 days.

(21) Appl. No.: 12/101,309

(22) Filed: Apr. 11, 2008

(65) Prior Publication Data

US 2009/0257150 A1 Oct. 15, 2009

(51) Int. Cl.
*H01G 9/00* (2006.01)
(52) U.S. Cl. .................. 361/502; 361/503; 361/504; 361/509; 361/512; 361/523
(58) Field of Classification Search .......... 361/502, 361/503–504, 508–512, 516–519, 523–529
See application file for complete search history.

(56) References Cited

U.S. PATENT DOCUMENTS

| | | | | |
|---|---|---|---|---|
| 6,021,039 A * | 2/2000 | Inagawa | ................ | 361/502 |
| 6,341,058 B1 * | 1/2002 | Sakata et al. | ................ | 361/502 |
| 6,359,769 B1 * | 3/2002 | Mushiake et al. | ........... | 361/502 |
| 6,475,670 B1 * | 11/2002 | Ito | .............................. | 429/217 |
| 7,289,312 B2 * | 10/2007 | Duff, Jr. | ..................... | 361/502 |
| 7,486,497 B2 * | 2/2009 | Kobayashi et al. | .......... | 361/502 |

\* cited by examiner

*Primary Examiner*—Nguyen T Ha
(74) *Attorney, Agent, or Firm*—Thomas, Kayden, Horstemeyer & Risley, LLP

(57) ABSTRACT

An apparatus for storing electrical energy is provided. The apparatus includes a first magnetic layer, a second magnetic layer, and a dielectric layer. The first magnetic layer has a first surface with saw tooth roughness; the second magnetic layer has a second surface with saw tooth roughness; and the dielectric layer is configured between the first magnetic layer and the second magnetic layer. The dielectric layer is arranged to store electrical energy; the first magnetic layer and the second magnetic layer are arranged to prevent electrical energy leakage; and the saw tooth roughness on the first surface and the second surface is designed to increase the capacitance of the apparatus.

11 Claims, 8 Drawing Sheets

APPARATUS FOR STORING ELECTRICAL ENERGY

BACKGROUND

1. Field of Invention

The present invention relates to an apparatus for storing electrical energy. More particularly, the present invention relates to a magnetic capacitor for storing electrical energy.

2. Description of Related Art

Energy storage parts play important roles in our daily life since they influence the performance and the working time of electrical devices. Components such as capacitors used in the circuits and batteries used in portable devices are the most common energy storage parts.

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

Therefore, the GMR effect can be used to as an insulator with good performance. Thus, the apparatus with the GMR effect can be implemented to store electrical energy. A magnetic capacitor is an example of the apparatus with the GMR effect. Magnetic capacitors are formed with magnetic plates. A magnetic plate has a north pole and a south pole, and the north pole and south pole have the strongest magnetic field along the magnetic plate. In reality, the magnetic field strength is summarized and combined with all magnetic dipoles along easy axis. Please refer to FIG. 1A FIG. 1A shows localized dipoles of magnetic plates in a magnetic capacitor. The magnetic capacitor includes a first magnetic plate 110, a second magnetic plate 120, and a dielectric layer 130. The first magnetic plate 110 and the second magnetic plate 120 have dipoles pointing in the same directions.

Refer to FIG. 1B. FIG. 1B shows a magnetic plate and the magnetic field contour of the magnetic plate showing the field strength intensity. The density of the magnetic field lines in the magnetic field contour represents the magnetic field strength. As shown in FIG. 1B, the magnetic field strength decreases from two sides of the magnet plate. Due to the magnetic field effect, magnetic capacitors have shown colossal capacitance. Therefore the colossal magnetic effect is reduced from the edge to the center of the magnet plate. However, as the sizes of electrical devices continue to shrink, the need to store more capacitance in a limited area is rising.

For the foregoing reasons, there is a need to have an apparatus with the GMR effect and large capacitance values to store electrical energy.

SUMMARY

It is therefore an objective of the present invention to provide an apparatus for storing electrical energy with large capacitance values.

According to one embodiment of the present invention, the apparatus includes a first magnetic layer, a second magnetic layer, and a dielectric layer. The first magnetic layer has a first surface with saw tooth roughness; the second magnetic layer has a second surface with saw tooth roughness; and the dielectric layer is configured between the first magnetic layer and the second magnetic layer. The dielectric layer is arranged to store electrical energy; the first magnetic layer and the second magnetic layer are arranged to prevent electrical energy leakage; and the saw tooth roughness on the first surface and the second surface is designed to increase the capacitance of the apparatus.

The first magnetic layer includes a first magnetic section having magnetic dipoles with horizontal directions and a second magnetic section having magnetic dipoles with vertical directions, and the second magnetic layer includes a third magnetic section having magnetic dipoles with horizontal directions and a forth magnetic section having magnetic dipoles with vertical directions.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
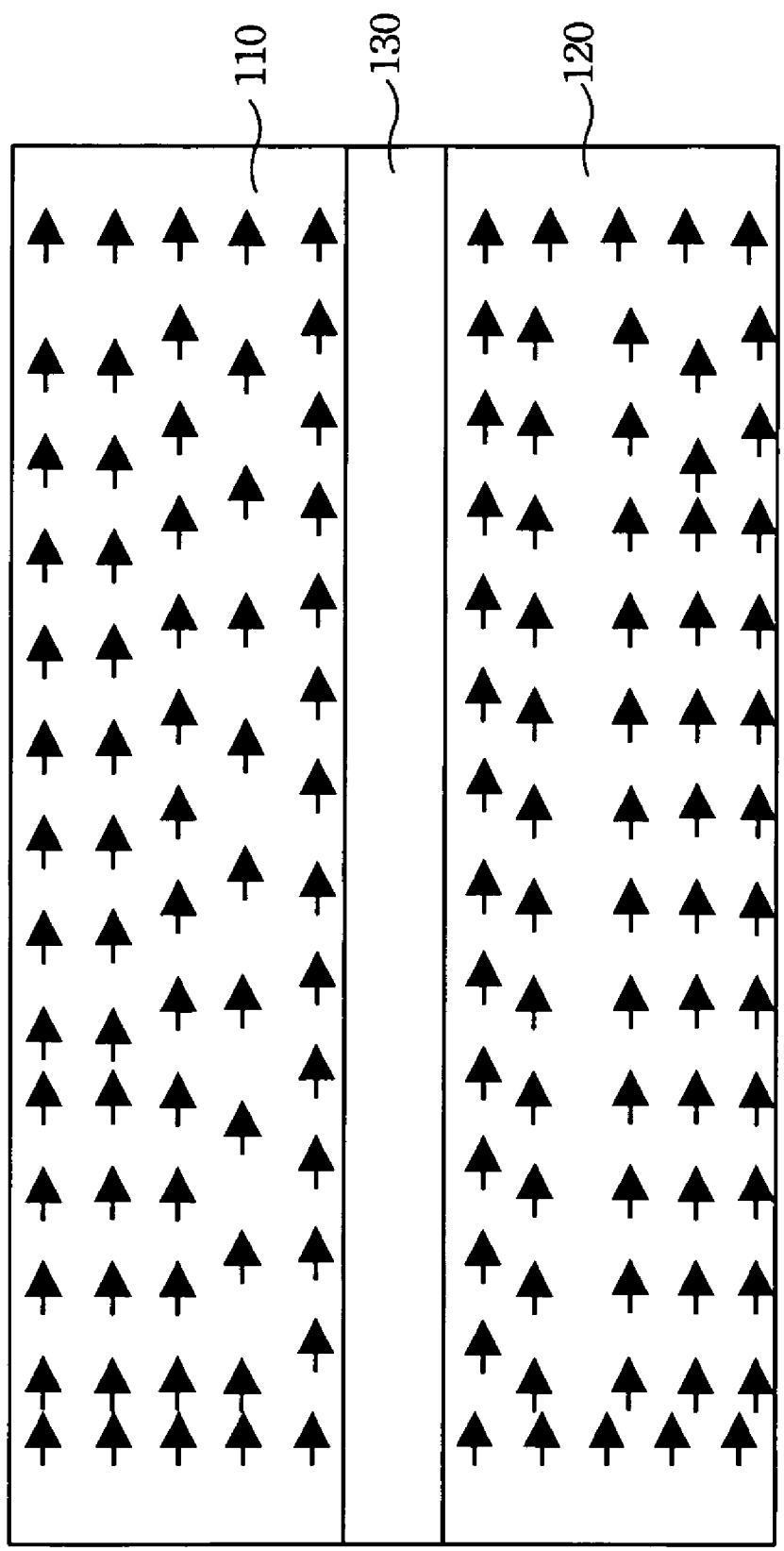
FIG. 1A shows localized dipoles of magnetic plates in a magnetic capacitor.
Figure 1B:
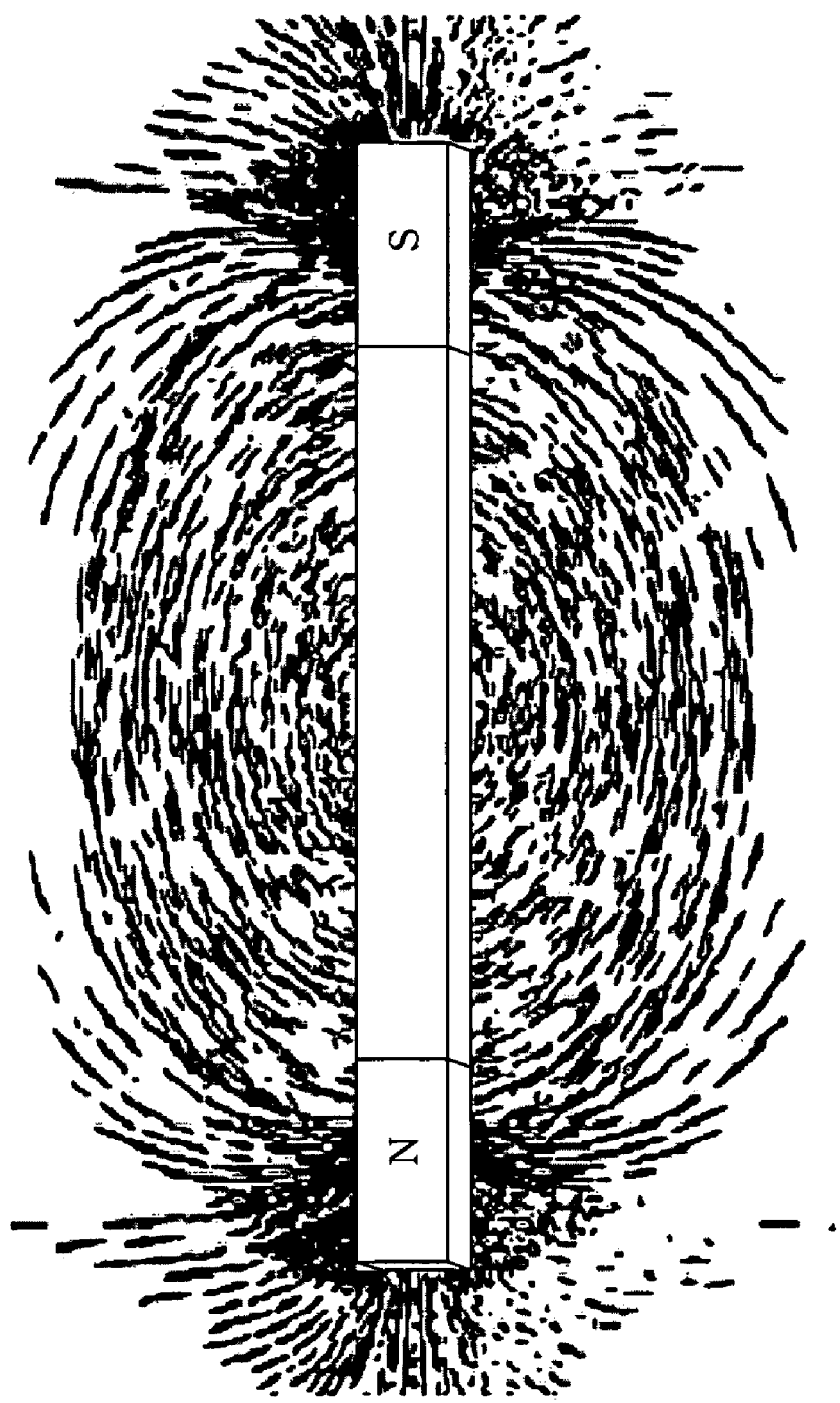
FIG. 1B illustrates a magnetic plate and the magnetic field contour of the magnetic plate showing the field strength intensity.

Reference will now be made in detail to the present preferred embodiments of the invention, examples of which are illustrated in the accompanying drawings. Wherever possible, the same reference numbers are used in the drawings and the description to refer to the same or like parts.

Figure 2:
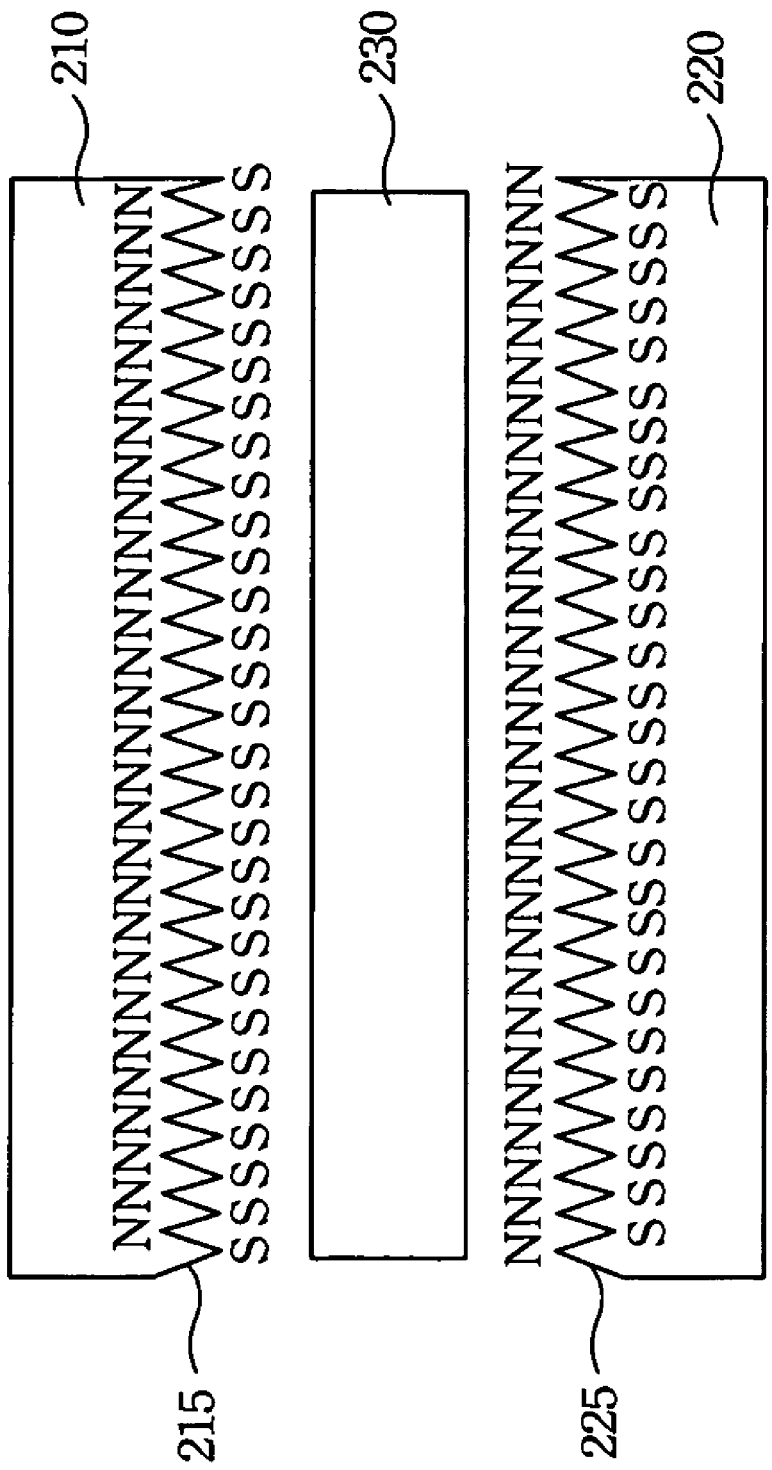
FIG. 2A shows an apparatus for storing electrical energy according to an embodiment of the invention.
FIG. 2B shows localized dipoles of an apparatus for storing electrical energy according to an embodiment of the invention.

Reference is now made to FIG. 2A, showing an apparatus for storing electrical energy according to an embodiment of the invention. The apparatus for storing electrical energy is a magnetic capacitor. The magnetic capacitor includes a first magnetic layer 210, a second magnetic layer 220, and a dielectric layer 230. The first magnetic layer 210 has a first surface 215 with saw tooth roughness; the second magnetic layer 220 has a second surface 225 with saw tooth roughness; and the dielectric layer 230 is configured between the first magnetic layer 210 and the second magnetic layer 220. The dielectric layer 230 is arranged to store electrical energy; the first magnetic layer 210 and the second magnetic layer 220 are arranged to prevent electrical energy leakage; and the saw tooth roughness on the first surface 215 and the second surface 225 increases the surface area of the first surface 215 and the second surface 225, and thus increases the capacitance of the magnetic capacitor.

The dielectric layer 230 is a thin film, and the dielectric layer 230 is composed of dielectric material, such as $BaTiO_3$ or $TiO_3$. However, the dielectric material is not a perfect insulator. A small amount of current passes through the dielectric layer 230.

Therefore, the first magnetic layer 210 and the second magnetic layer 220 are needed to generate the insulating-effect to prevent the current from passing through (i.e. electrical energy leakage). The first and second magnetic layers 210 and 220 are magnetic thin films, and these two magnetic layers are used to prevent electrical energy leakage.

Figure 2B:
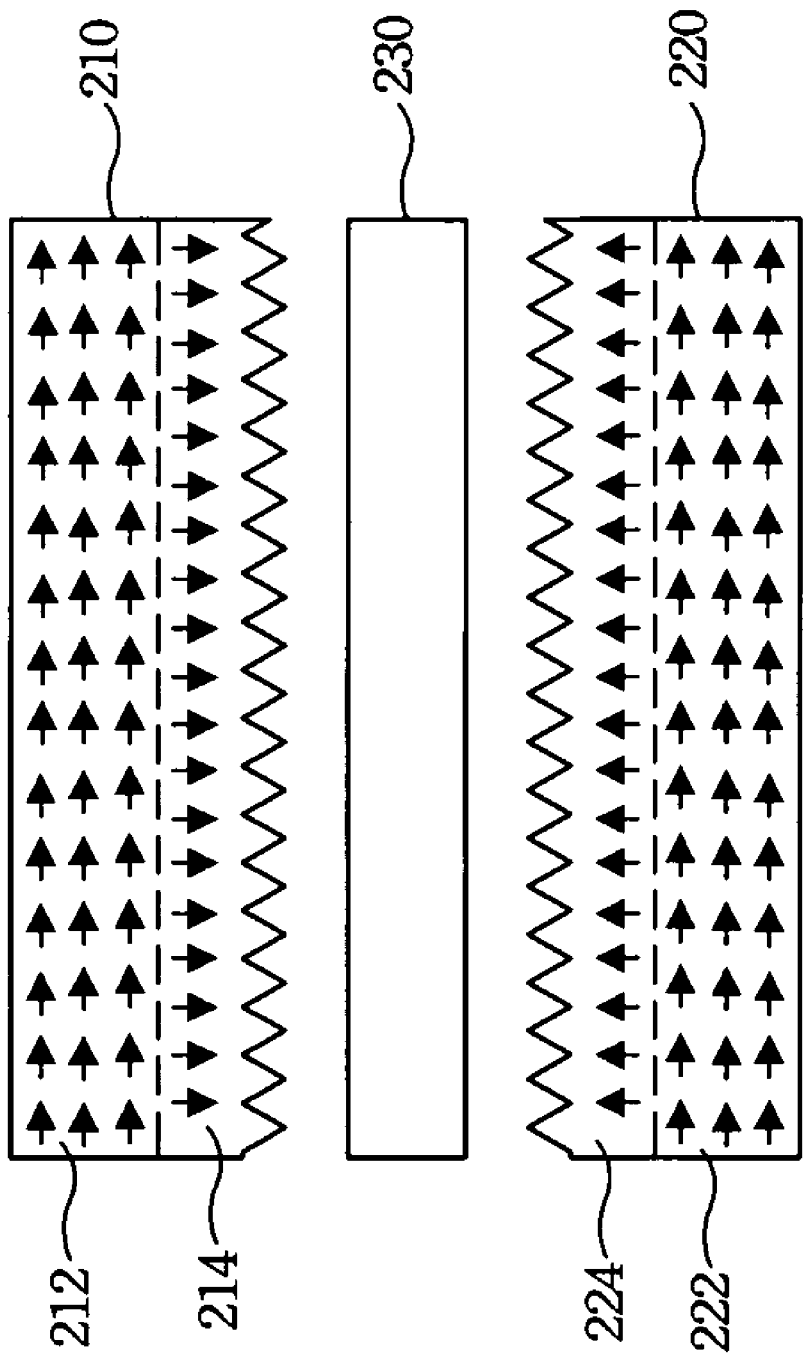

Reference is now made to FIG. 2B, showing localized dipoles of an apparatus for storing electrical energy according to an embodiment of the invention. The first magnetic layer 210 includes a first magnetic section 212 having magnetic dipoles with horizontal directions and a second magnetic section 214 having magnetic dipoles with vertical directions, and the second magnetic layer 220 includes a third magnetic section 222 having magnetic dipoles with horizontal directions and a forth magnetic section 224 having magnetic dipoles with vertical directions. When the apparatus stores electrical energy, the magnetic dipoles of the first magnetic section 212 and the third magnetic section 222 have the same horizontal directions.

When the apparatus stores electrical energy, the dipoles of the first magnetic section 212 and the third magnetic section 222 are the same. Therefore, the first magnetic section 212 and the third magnetic section 222 prevent electrical energy leakage, and electrical energy can be stored in the dielectric layer 230.

Namely, when the dipoles of the first magnetic section 212 and the third magnetic section 222 are the same, the spin directions of the electrons of the dielectric layer 230 point toward one direction. The current leakage is reduced thereby. When the current leakage is reduced, the energy is stored for a longer period of time and there is less loss of electrical energy. It is noted that the symbols '→' are just arranged to represent the dipoles of the magnetic sections, and are not arranged to restrict the dipole directions.

Figure 3:
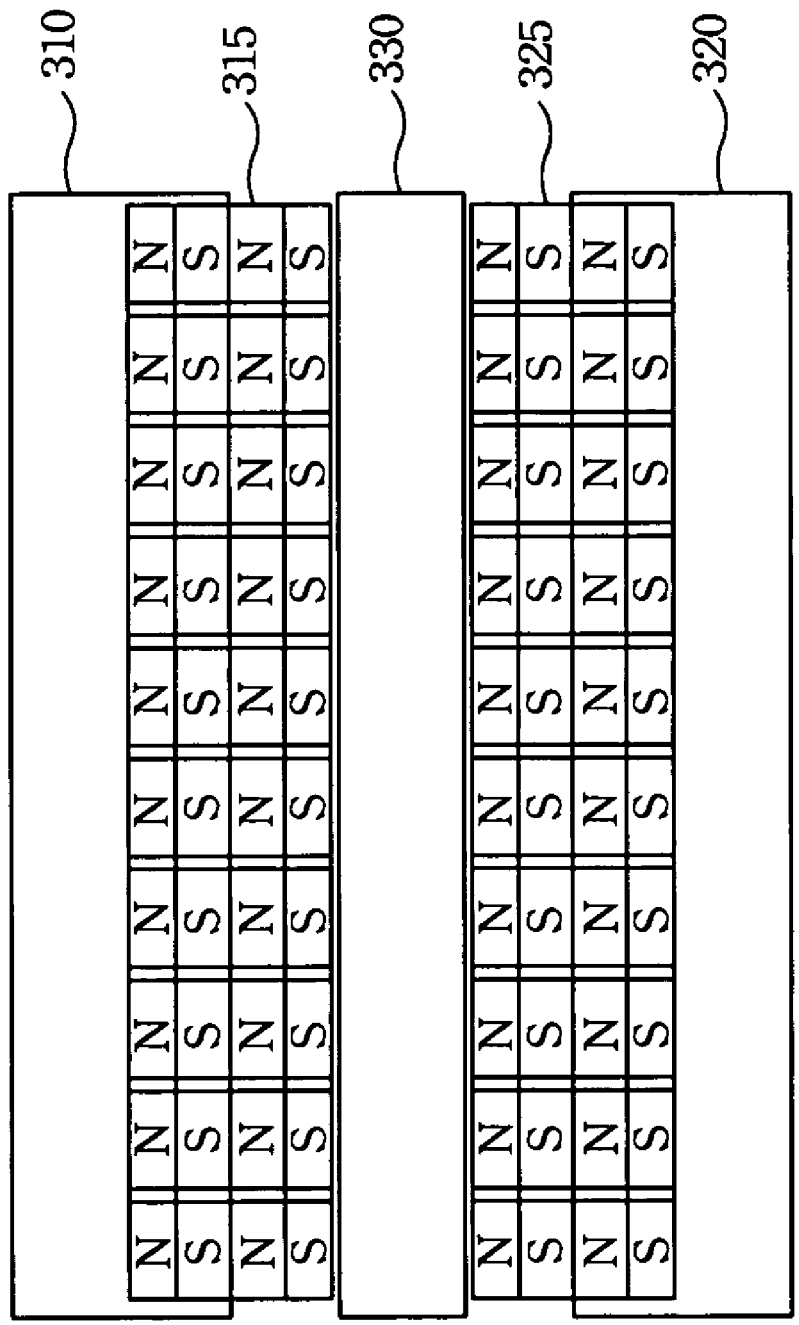
FIG. 3 shows a magnetic capacitor with nano magnets along the inner side of the capacitor plates.

Reference is now made to FIG. 3, showing a magnetic capacitor with nano magnets along the inner side of the capacitor plates. The saw tooth roughness of the magnetic capacitor shown in FIG. 2A has the effect of building up nano magnets 315 and 325 along the inner side of the magnetic plates 310 and 320 shown here. A dielectric layer 330 is configured in between the magnetic plates 310 and 320. Without the existence of nano magnets 315 and 325, the north poles and south poles along the magnetic plates have the strongest magnetic field, and the colossal magnetic effect is reduced from the edge of magnetic plates to the center. The nano magneto effect created by nano magnets 315 and 325 can complement this weakness of magnetic capacitors. Thus, the magnetic field strength of the magnetic capacitor has increased due to the magnetic dipoles with vertical directions.

Figure 4:
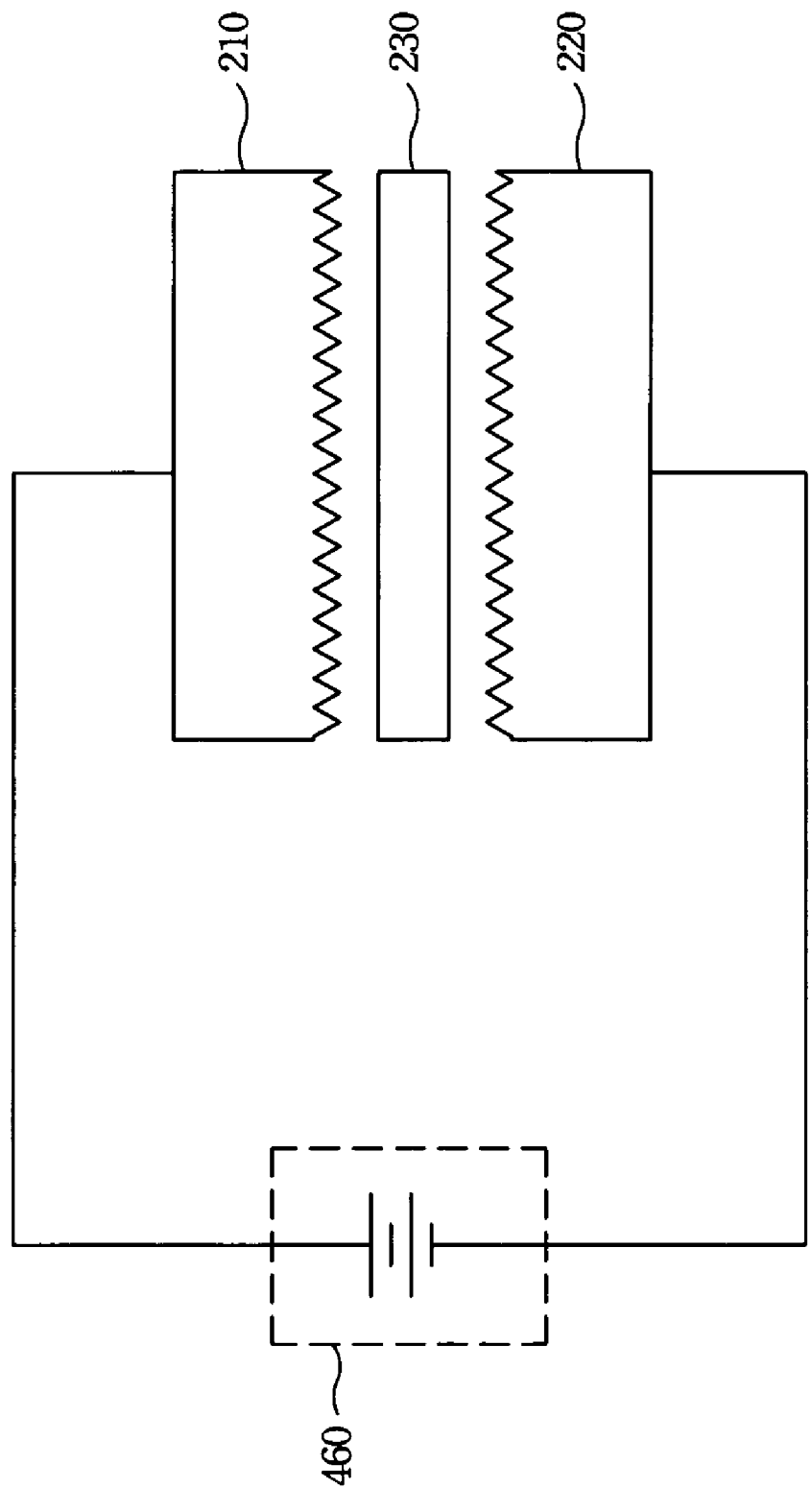
FIG. 4 shows the apparatus while the apparatus is being charged according to an embodiment of the invention.

FIG. 4 shows the apparatus while the apparatus is being charged according to an embodiment of the invention. While the apparatus is being charged, the first magnetic layer 210 and the second magnetic layer 220 are coupled to a power source 460. The electrical energy can be inputted into the dielectric layer 230 from the power source 460.

Figure 5:
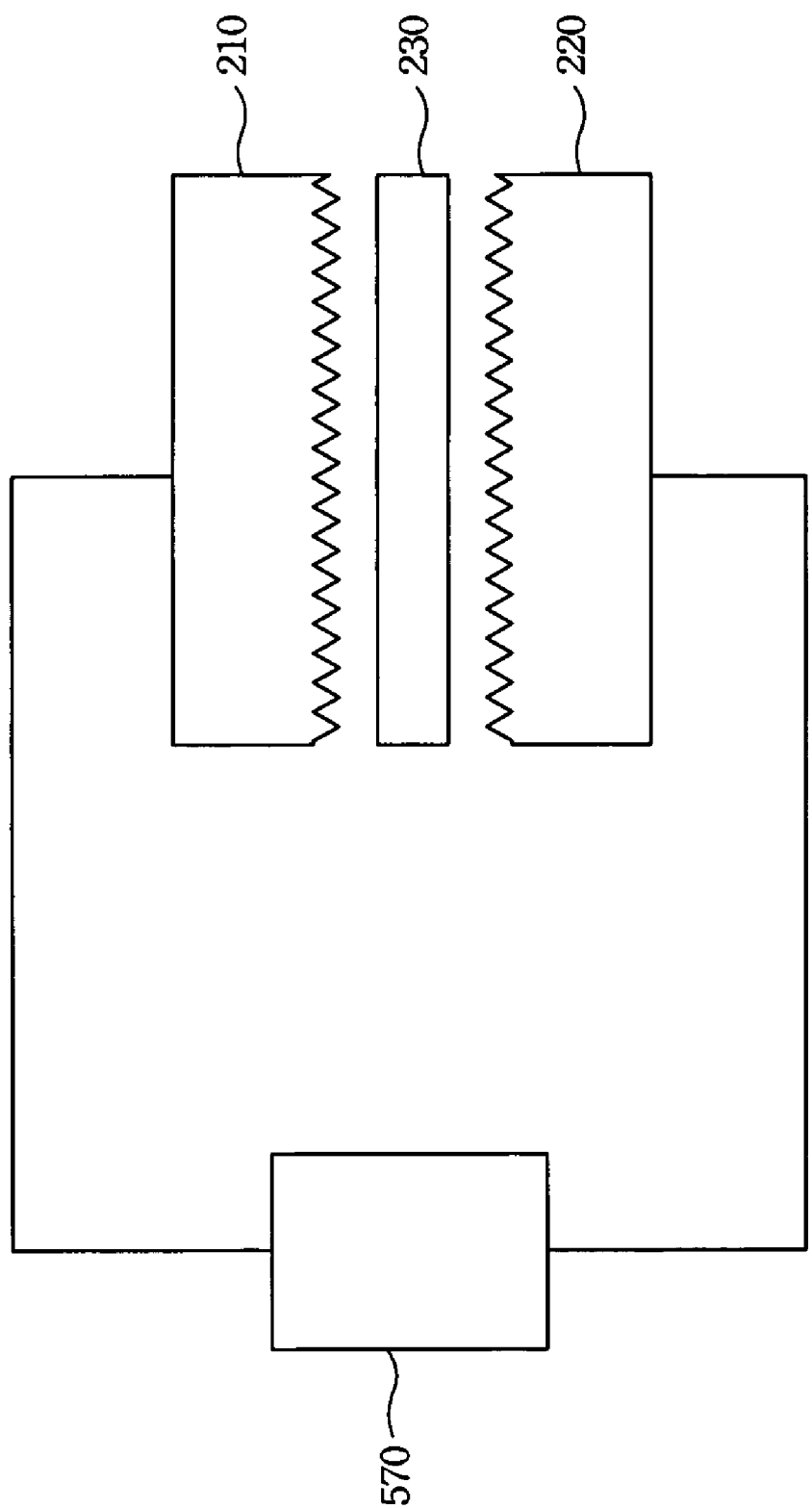
FIG. 5 shows the apparatus while the apparatus is being discharged according to an embodiment of the invention.

FIG. 5 shows the apparatus while the apparatus is being discharged according to an embodiment of the invention. While the apparatus is being discharged, the first magnetic layer 210 and the second magnetic layer 220 are coupled to a loading device 570. The electrical energy can be outputted from the dielectric layer 230 to the loading device 570.

The power source or the loading device can influence the dipoles of the magnetic layers 210 and 220 easily, and the insulating-effect of the magnetic layers 210 and 220 is not good thereby. Therefore the current can be transmitted through the magnetic sections.

Figure 6:
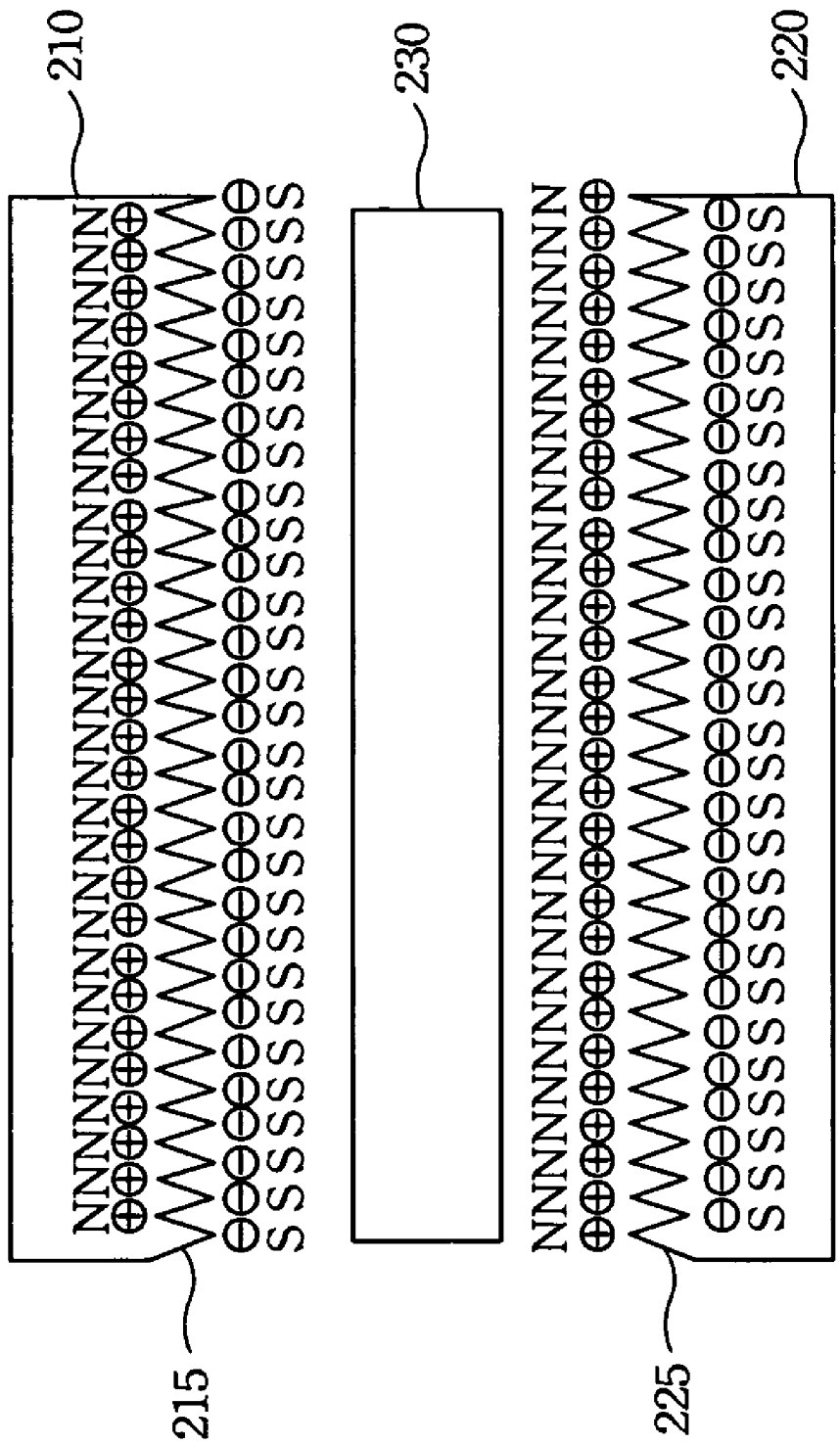
FIG. 6 shows the apparatus after the apparatus is charged according to an embodiment of the invention.

FIG. 6 shows the apparatus after the apparatus is charged according to an embodiment of the invention. When electrodes are applied on both sides of the magnetic capacitor, it will generate electric dipoles on the first surface 215 of the first magnetic layer 210 and the second surface 225 of the second magnetic layer 220 as well. The capacitance will increase in the order of magnitude not only due to the increase of the capacitor area but also due to the increases of magnetic field strength.

In conclusion, the invention provides an apparatus for storing electrical energy with large capacitance values because of the saw tooth roughness structure of the apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for storing electrical energy, comprising:
   a first magnetic layer having a first surface with saw tooth roughness;
   a second magnetic layer having a second surface with saw tooth roughness;
   a dielectric layer configured between the first magnetic layer and the second magnetic layer;
   wherein the dielectric layer is arranged to store electrical energy, the first magnetic layer and the second magnetic layer are arranged to prevent electrical energy leakage, and the saw tooth roughness on the first surface and the second surface is designed to increase capacitance of the apparatus;
   wherein the first magnetic layer comprises a first magnetic section having a plurality of magnetic dipoles with horizontal directions and a second magnetic section having a plurality of magnetic dipoles with vertical directions, and the second magnetic layer comprises a third magnetic section having a plurality of magnetic dipoles with horizontal directions and a forth magnetic section having a plurality of magnetic dipoles with vertical directions.

2. The apparatus of claim 1, wherein when the apparatus stores electrical energy, magnetic dipoles of the first magnetic section and the third magnetic section have the same horizontal directions.

3. The apparatus of claim 1, wherein a magnetic field strength of the apparatus increases due to magnetic dipoles with vertical directions.

4. The apparatus of claim 1, wherein the dielectric layer is a thin film.

5. The apparatus of claim 1, wherein the dielectric layer is composed of dielectric material.

6. The apparatus of claim 1, wherein the first magnetic layer is a magnetic thin film.

7. The apparatus of claim 1, wherein the second magnetic layer is a magnetic thin film.

8. The apparatus of claim 1, wherein the saw tooth roughness increases a surface area of the first surface.

9. The apparatus of claim 1, wherein the saw tooth roughness increases a surface area of the second surface.

10. The apparatus of claim 1, wherein while the apparatus is being charged, the first magnetic layer and the second magnetic layer are coupled to a power source.

11. The apparatus of claim 1, wherein while the apparatus is being discharged, the first magnetic layer and the second magnetic layer are coupled to a loading device.

* * * * *